(12) United States Patent
Zhang et al.

(10) Patent No.: US 8,377,214 B2
(45) Date of Patent: Feb. 19, 2013

(54) VAPOR CHAMBER AND METHOD FOR MANUFACTURING THE SAME

(75) Inventors: Sheng-Chao Zhang, Shenzhen (CN); Zhi-Yong Zhou, Shenzhen (CN); Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 836 days.

(21) Appl. No.: 12/534,880

(22) Filed: Aug. 4, 2009

(65) Prior Publication Data
US 2010/0294200 A1    Nov. 25, 2010

(30) Foreign Application Priority Data
May 19, 2009    (CN) .......................... 2009 1 0302451

(51) Int. Cl.
*C23C 16/00* (2006.01)
(52) U.S. Cl. ........ 118/733; 118/726; 29/460; 29/890.03
(58) Field of Classification Search ........................ None
See application file for complete search history.

(56) References Cited

U.S. PATENT DOCUMENTS
2008/0040925 A1 *    2/2008    Lee et al. ................... 29/890.03
* cited by examiner

*Primary Examiner* — Robert Xu
(74) *Attorney, Agent, or Firm* — Altis Law Group, Inc.

(57) ABSTRACT

A vapor chamber includes a sealed flattened casing containing working liquid therein, a wick structure arranged on an inner face of the casing, a supporting plate received in the casing and a plurality of supporting posts. The supporting plate defines a plurality of fixing holes therein. The supporting posts are engagingly received in the fixing holes of the supporting plate. Top and bottom ends of the supporting posts engage with the wick structure to reinforce a structure of the vapor chamber.

9 Claims, 7 Drawing Sheets

VAPOR CHAMBER AND METHOD FOR MANUFACTURING THE SAME

BACKGROUND

1. Technical Field

The disclosure relates to a vapor chamber and, more particularly, to a vapor chamber having a firm structure.

2. Description of Related Art

Nowadays, numerous vapor chambers are used to dissipate and transfer heat generated by electronic devices. Generally, the vapor chamber includes a plate-shape casing having a lower plate thermally contacting the electronic device. A vacuum chamber is defined in the casing. A wick structure is formed on an inner face of the casing, and a working fluid is contained in the chamber. As the electronic device is maintained in thermal contact with the lower plate of the casing, the working fluid contained in the chamber corresponding to a hotter location vaporizes into vapor. The vapor then spreads to fill the chamber, and wherever the vapor comes into contact with a cooler location of the chamber, it releases its latent heat and condenses to liquid. The liquid returns to the hotter location via a capillary force generated by the wick structure. Thereafter, the working fluid frequently vaporizes and condenses to form a circulation to thereby remove the heat generated by the electronic device.

However, the plate-shape casing of the vapor chamber is prone to deforming when subjected to an inner or outer pressure during use, which further results in the wick structure disengagement from the inner face of the casing, adversely affecting the stability of the vapor chamber.

What is needed, therefore, is a vapor chamber which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

As shown in FIGS. 1-5, a method of manufacturing a vapor chamber in accordance with a first embodiment of the disclosure includes a plural steps described in the following.

Figure 1:
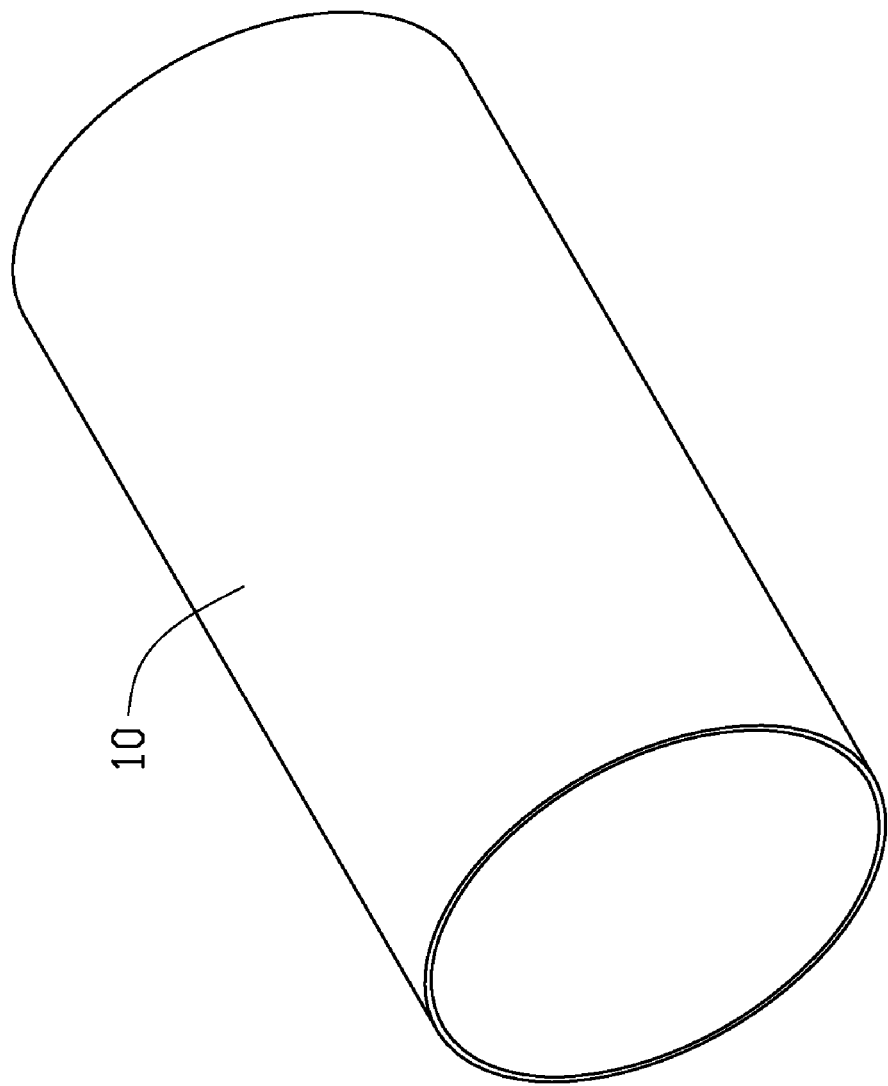
FIG. 1 is a schematic view of a metal tube for manufacturing a casing of a vapor chamber in accordance with a first embodiment of the present disclosure.

Firstly, as particularly shown in FIG. 1, a metal tube 10 is provided. The metal tube with a predetermined length is made of a material with a good thermal conductivity such as copper.

Figure 2:
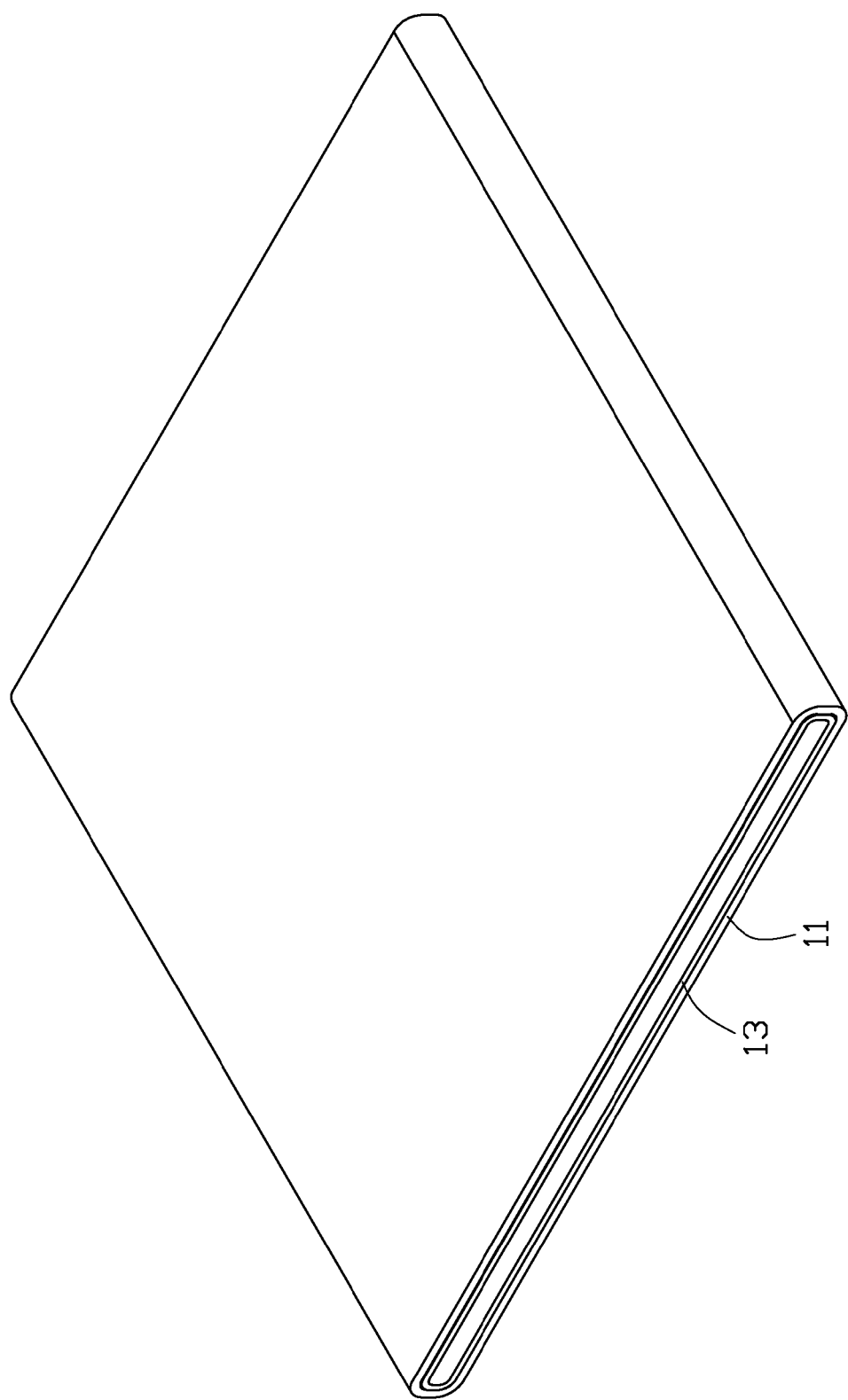
FIG. 2 is a schematic view of the metal tube of FIG. 1 being flattened into the casing with a wick structure arranged on an inner face thereof.

Secondly, as particularly shown in FIG. 2, the metal tube 10 is flattened into a rectangular plate-shape casing 11 and thus has two elongated openings at two opposite ends thereof.

Thirdly, an insert (not shown) is provided and inserted into the casing 11. The insert has a configuration similar to that of the casing 11, but is in a slightly smaller size than the casing 11. Metal powder is filled between an inner face of the casing and an outer surface of the insert and then is sintered on the inner face of the casing 11 to form a wick structure 13 over the inner face of the casing 11 by heat treating the casing 11. In this embodiment of the present disclosure, the insert is a solid block made of metal and taken out after the powder is sintered on the inner face of the casing 11. In alternative embodiments of the present disclosure, the insert can be a hollow block formed by weaving meshes and simultaneously sintered on the inner face of the casing 11 to be a part of the wick structure 13.

Figure 3:
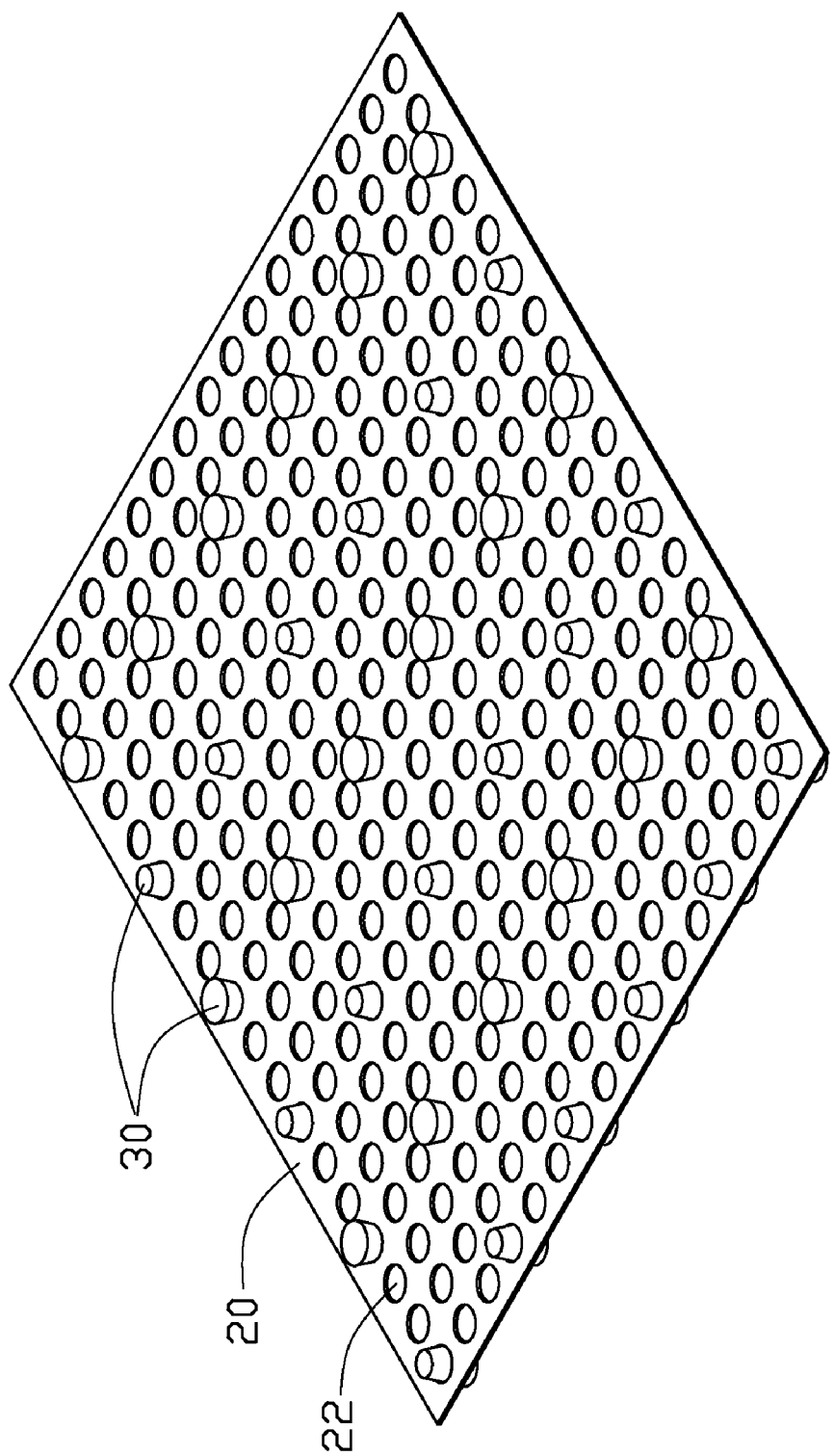
FIG. 3 is a schematic view of a supporting structure of the vapor chamber.
Figure 4:
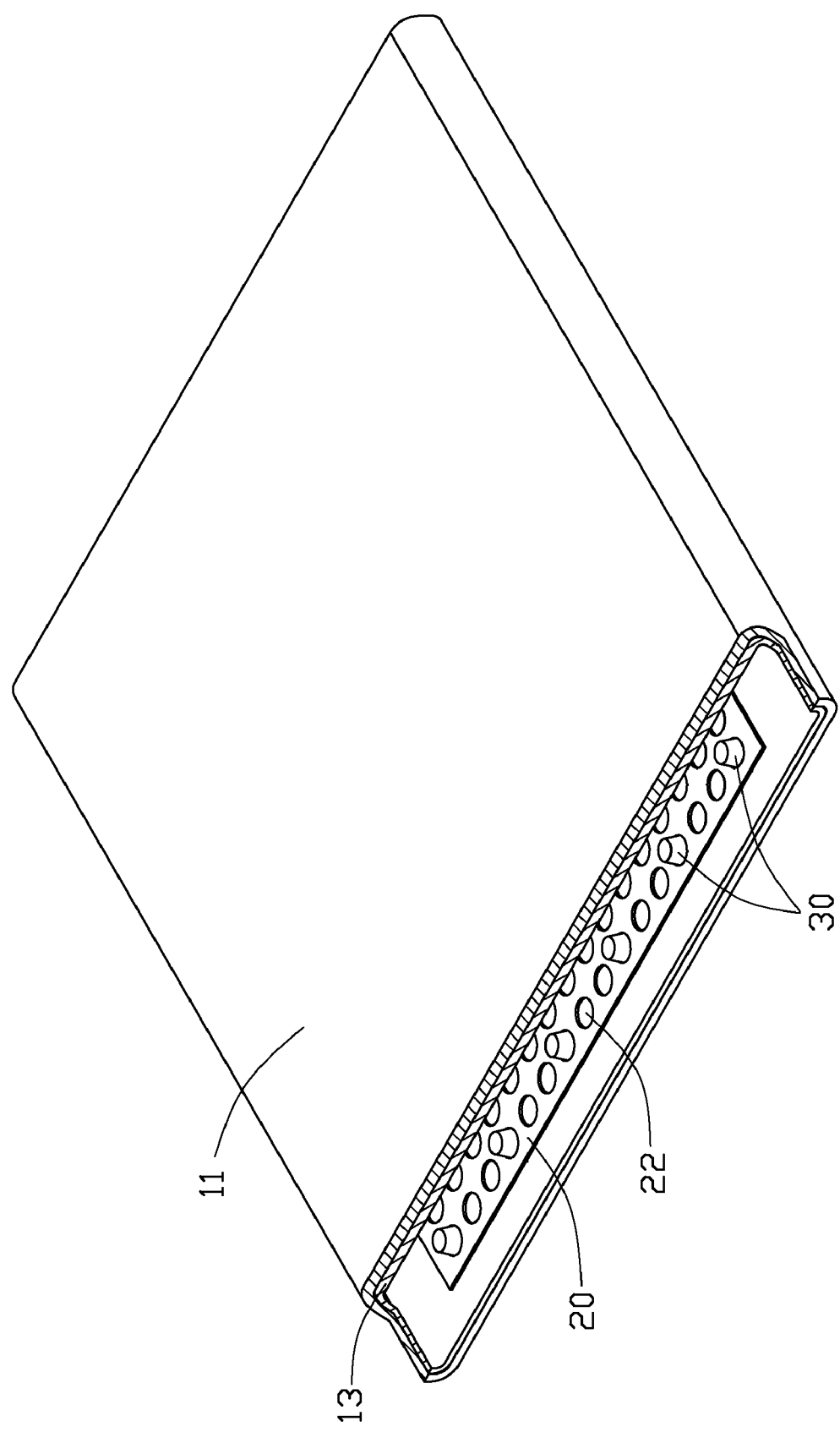
FIG. 4 is a schematic view of the casing of the vapor chamber of FIG. 2 receiving the supporting structure of FIG. 3 therein, in which a part of the casing is cut away for clarity.
Figure 5:
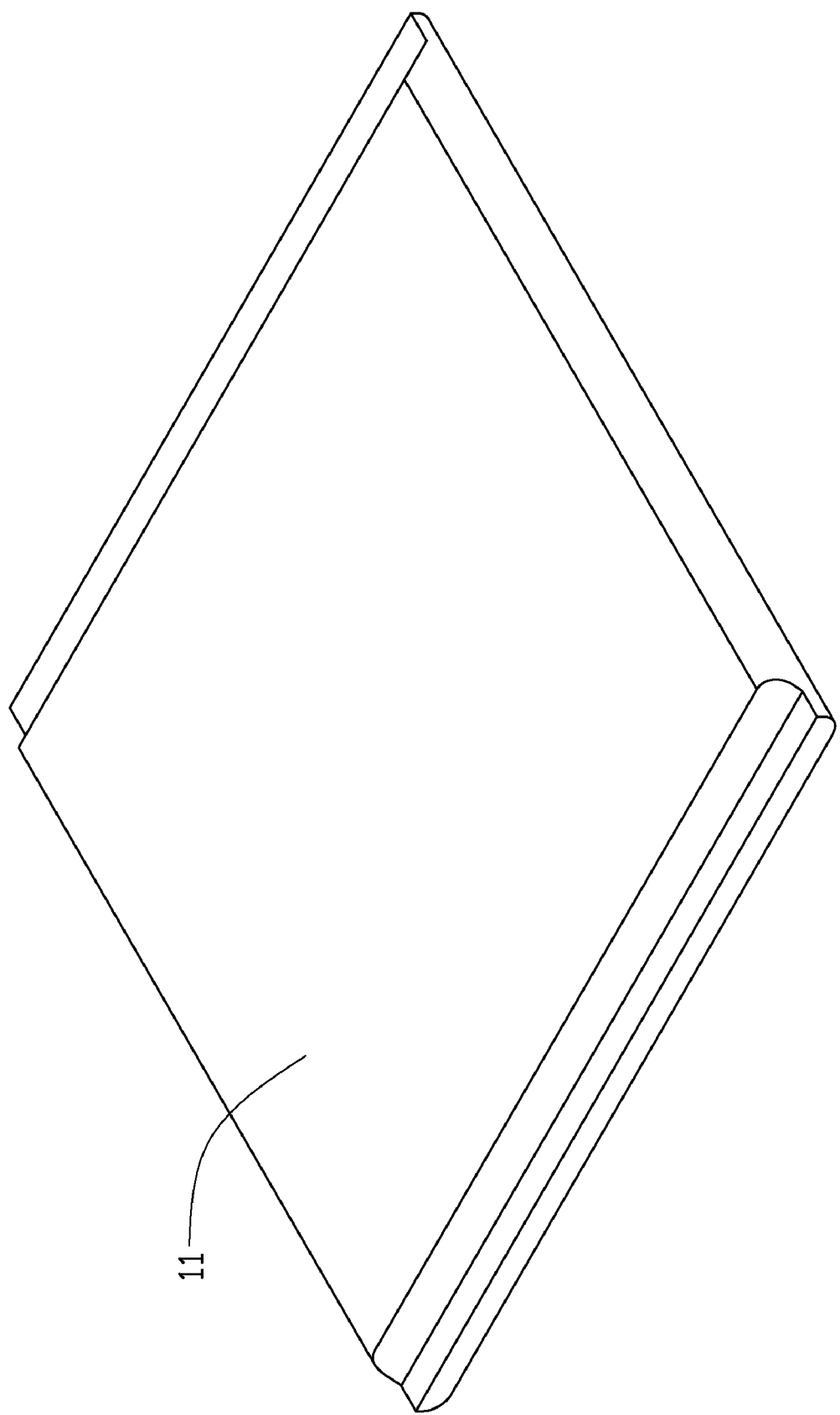
FIG. 5 is an isometric, assembled view of the vapor chamber of FIG. 4.

Fourthly, as particularly shown in FIG. 3, a supporting plate 20 is provided. The supporting plate 20 has a rectangular configuration and is in a size slightly smaller than the chamber defined in the casing 11, so that the supporting plate 20 can be fitly received in the casing 11. A plurality of fixing holes 22 are defined in the supporting plate 20 and arranged in a matrix.

Fifthly, a plurality of supporting posts 30 are provided and respectively inserted into a part of the fixing holes 22 of the supporting plate 20, whereby a combination of the supporting posts 30 and the supporting plate 20 forms a supporting structure of the vapor chamber to prevent the casing 11 from deforming due to unexpected outer or inner pressures. Each supporting post 30 has a diameter gradually increasing from one end to another opposite end thereof. A diameter of the middle of each supporting post 30 is slightly larger than an aperture of the fixing hole 22, whereby the middle of the supporting post 30 is interferingly fitted in the fixing hole 22 of the supporting plate 20. Another part of the vacant fixing holes 22 act as vapor passages for vaporized working liquid passing therethrough during working of the vapor chamber. The fixing posts 30 are symmetrically or evenly distributed over the supporting plate 20, so that the vapor passages are evenly distributed over the supporting plate 20. Each supporting post 30 has a large end and a small end having a diameter less than that of the large end. The supporting posts 30 can be inserted into the fixing holes 30 from either side of the supporting plate 20, thus the large ends of the supporting posts 30 can be located at opposite sides of supporting plate 20. In this embodiment of the present disclosure, the large ends and the small ends of the supporting posts 30 in a column of the matrix are alternately arranged at the same side of the supporting plate 20 for strengthening the supporting structure of the vapor chamber.

In the following step, the assembly of the supporting posts 30 and the supporting plate 20 is placed into the casing 11. The casing 30 is then simultaneously pressed downwardly and upwardly on two opposite outer flat surfaces thereof to make top and bottom surfaces of the supporting posts 30 engage the wick structure 13 arranged on two facing inner faces of the casing 11.

Finally, the casing 11 is filled with working liquid, then vacuumed and finally sealed by punching two opposite ends of the casing 11, to thus complete a manufacturing of the vapor chamber incorporating the supporting structure therein.

Figure 6:
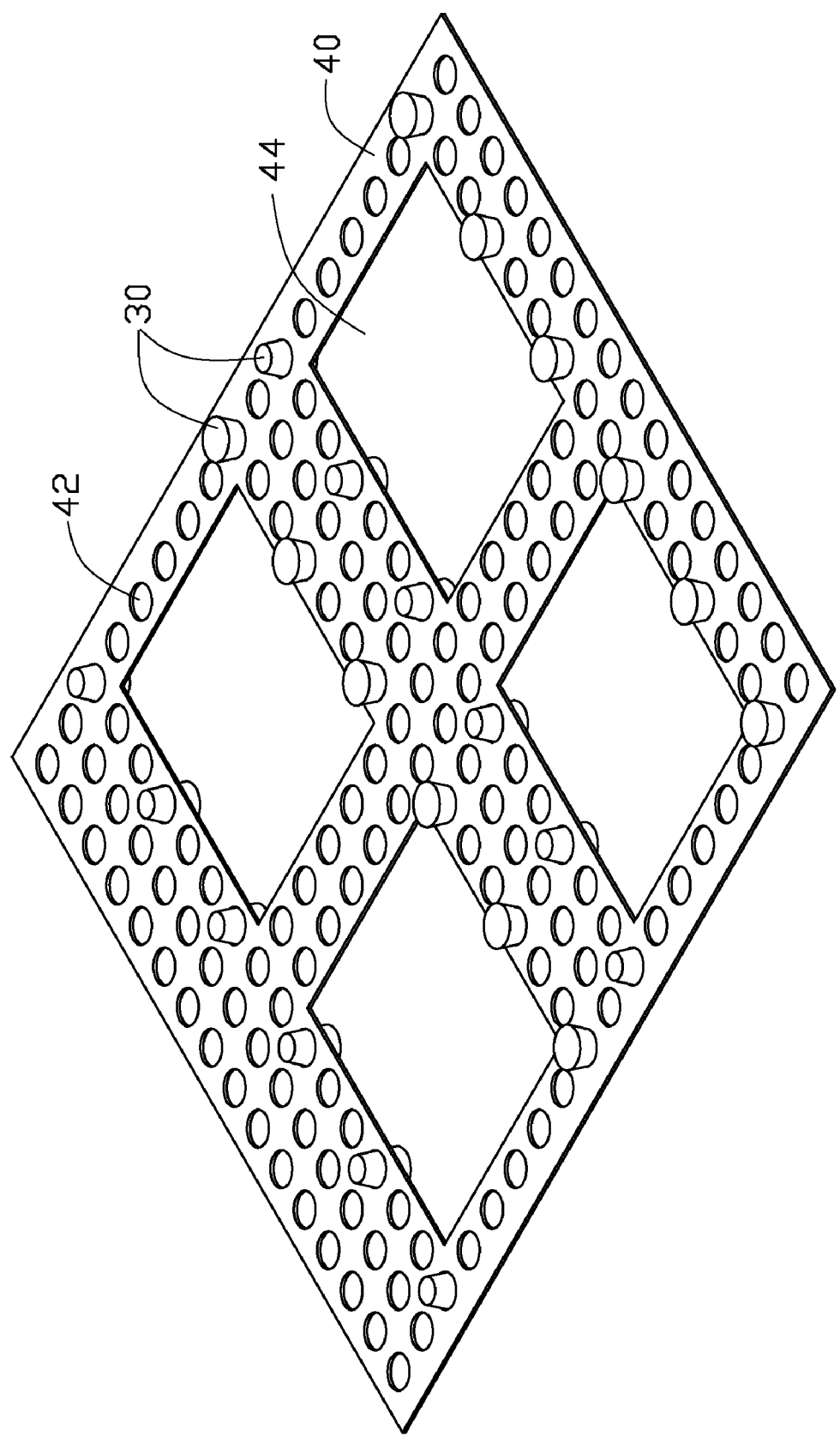
FIG. 6 is a schematic view of a supporting structure of a vapor chamber in accordance with a second embodiment of the disclosure.

A second embodiment of the disclosure is similar to that of the first embodiment, except a supporting plate 40. As shown in FIG. 6, the supporting plate 40 is rectangular and has a size similar to that of the supporting plate 20 of the first embodiment. The supporting plate 40 defines a plurality of fixing holes 42 therein for interferingly receiving the supporting posts 30 therein. A plurality of rectangular openings 44 each having a size much larger than that of the fixing hole 42 are defined in the supporting plate 40 and located between two neighboring rows of the fixing holes 42 for vaporized working liquid passing therethrough.

Figure 7:
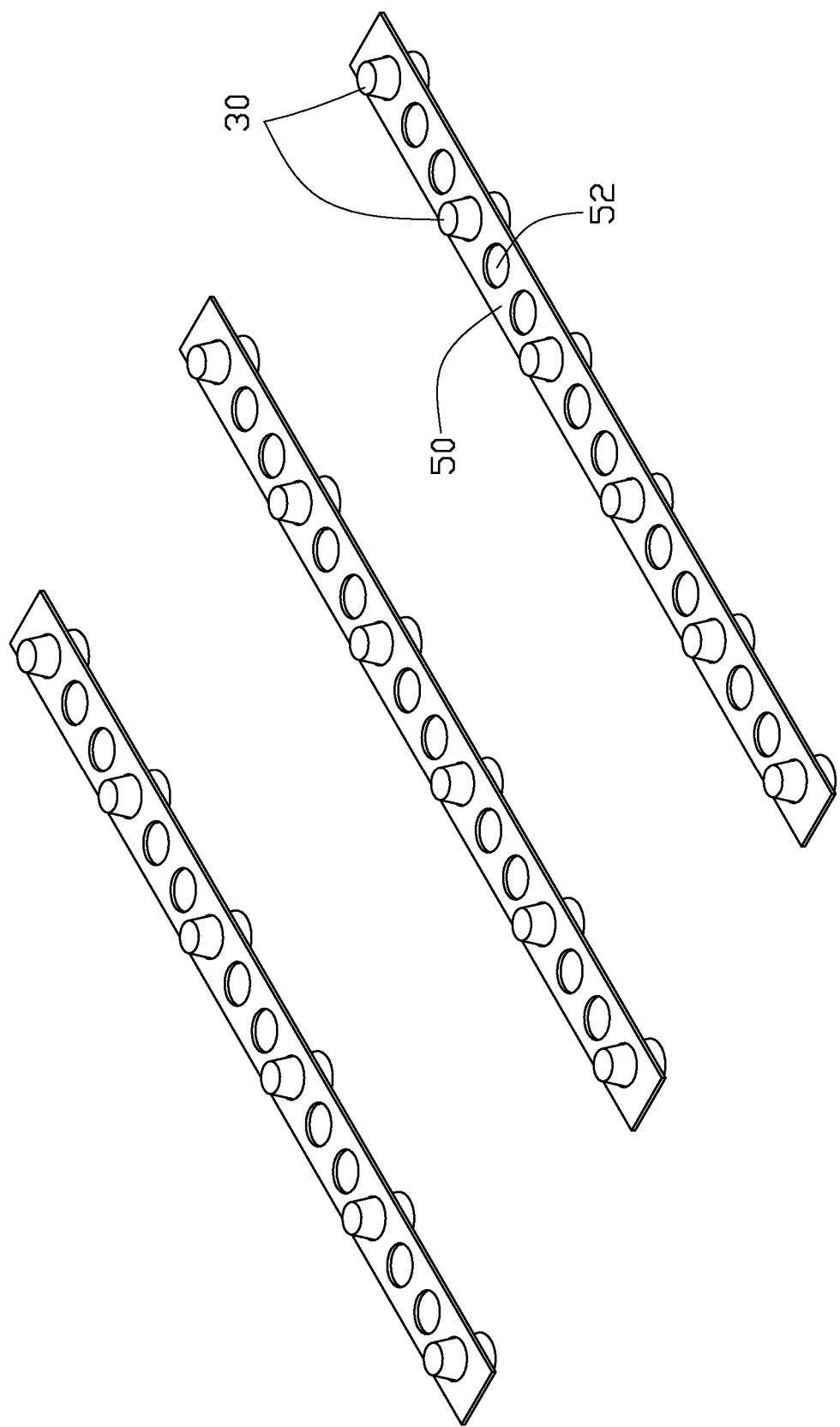
FIG. 7 is a schematic view of a supporting structure of a vapor chamber in accordance with a third embodiment of the disclosure.

A third embodiment of the disclosure is similar to that of the previous embodiments, except a supporting structure. As shown in FIG. 7, the supporting structure of the third embodiment includes a plurality of elongated supporting plates 50. The supporting plates 50 are parallel to and spaced from each other. A plurality of fixing holes 52 are defined in each supporting plate 50 along a lengthways direction and spaced from each other with a constant distance. The supporting posts 30 are interferingly fitted in part of the fixing holes 52. Plural fixing holes 52 are located between every two neighboring supporting posts 30 in the supporting plates 50.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A vapor chamber comprising:
  a sealed flattened casing containing working liquid therein;
  a wick structure arranged on an inner face of the casing;
  a supporting plate received in the casing and defining a plurality of fixing holes therein; and
  a plurality of supporting posts engagingly received in the fixing holes of the supporting plate wherein a middle portion of each supporting post is interferingly fitted in a corresponding fixing hole in the supporting plate; and a plurality of vapor passages are defined in the supporting plate.

2. The vapor chamber of claim 1, wherein the vapor passages are in a same configuration with the fixing holes and surround the supporting posts.

3. The vapor chamber of claim 1, wherein the vapor passages are rectangular openings each having a size much large than that of each of the fixing holes.

4. The vapor chamber of claim 1, wherein the supporting plate comprises a plurality of elongated members which are parallel and spaced from each other.

5. The vapor chamber of claim 1, wherein each supporting post has a large end and a small end opposite to the large end, a diameter of each supporting post being gradually decreased from the large end to the small end.

6. The vapor chamber of claim 5, wherein the supporting posts are inserted into the fixing holes from two different opposite sides of the supporting plate to make the large ends and small ends of the supporting posts located at different sides of the supporting plate.

7. The vapor chamber of claim 6, wherein the supporting posts are arranged in plural columns and rows in the supporting plate.

8. The vapor chamber of claim 7, wherein the large ends and the small ends of the supporting posts in a same column are alternately arranged at a same side of the supporting plate.

9. The vapor chamber of claim 1, wherein the supporting posts are sandwiched between two portions of the wick structure arranged on two facing inner faces of the casing.

\* \* \* \* \*